(12) United States Patent
Agarwal et al.

(10) Patent No.: US 8,148,189 B2
(45) Date of Patent: Apr. 3, 2012

(54) FORMED CERAMIC RECEIVER ELEMENT ADHERED TO A SEMICONDUCTOR LAMINA

(75) Inventors: Aditya Agarwal, Sunnyvale, CA (US); Kathy J Jackson, Felton, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 12/826,762

(22) Filed: Jun. 30, 2010

(65) Prior Publication Data

US 2012/0003775 A1 Jan. 5, 2012

(51) Int. Cl.
*H01L 31/18* (2006.01)
*H01L 21/71* (2006.01)

(52) U.S. Cl. ..... 438/68; 438/464; 438/73; 257/E21.536; 257/E31.002; 257/E21.001

(58) Field of Classification Search ........... 257/E21.001, 257/E21.085, E21.6; 438/68, 455, 458, 459, 438/463, 464, 73
See application file for complete search history.

(56) References Cited

U.S. PATENT DOCUMENTS

| | | | | |
|---|---|---|---|---|
| 4,127,424 A * | 11/1978 | Ullery, Jr. | ...................... | 136/244 |
| 4,255,316 A * | 3/1981 | Blizzard | ....................... | 524/433 |
| 5,234,676 A * | 8/1993 | Howard | ....................... | 423/412 |
| 5,356,488 A * | 10/1994 | Hezel | ............................. | 136/256 |
| 6,081,979 A * | 7/2000 | Kahn et al. | ..................... | 29/25.35 |
| 6,268,233 B1 * | 7/2001 | Sano | ................................. | 438/57 |
| 6,706,400 B2 * | 3/2004 | Mercuri et al. | ................. | 428/408 |
| 6,974,760 B2 * | 12/2005 | Ghyselen et al. | ............. | 438/459 |
| 7,351,644 B2 | 4/2008 | Henley | | |
| 8,101,451 B1 * | 1/2012 | Murali et al. | .................... | 438/57 |
| 2007/0277874 A1 | 12/2007 | Dawson-Elli et al. | | |
| 2007/0277875 A1 * | 12/2007 | Gadkaree et al. | ............. | 136/256 |
| 2008/0303118 A1 * | 12/2008 | Arena et al. | ................... | 257/615 |
| 2008/0308143 A1 | 12/2008 | Atanackovic | | |
| 2009/0071530 A1 | 3/2009 | Chan et al. | | |
| 2009/0194162 A1 * | 8/2009 | Sivaram et al. | ............... | 136/258 |
| 2010/0330731 A1 * | 12/2010 | Agarwal et al. | .................. | 438/73 |

OTHER PUBLICATIONS

Ravi, K.V., "Thin Single Crystal Silicon Solar Cells on Ceramic Substrates," Department of Energy Presentation, Solar Energy Technologies Program, May 25, 2010.
U.S. Appl. No. 12/026,530, filed Feb. 5, 2008.
U.S. Appl. No. 12/493,197, filed Jun. 27, 2009.
U.S. Appl. No. 12/493,195, filed Jun. 27, 2009.

* cited by examiner

*Primary Examiner* — Thao Le
*Assistant Examiner* — Sheng Zhu
(74) *Attorney, Agent, or Firm* — The Mueller Law Office, P.C.

(57) ABSTRACT

A method is described to create a thin semiconductor lamina adhered to a ceramic body. The method includes defining a cleave plane in a semiconductor donor body, applying a ceramic mixture to a first face of the semiconductor body, the ceramic mixture including ceramic powder and a binder, curing the ceramic mixture to form a ceramic body, and cleaving a lamina from the semiconductor donor body at the cleave plane, the lamina remaining adhered to the ceramic body. Forming the ceramic body this way allows outgassing of volatiles during the curing step. Devices can be formed in the lamina, including photovoltaic devices. The ceramic body and lamina can withstand high processing temperatures. In some embodiments, the ceramic body may be conductive.

20 Claims, 7 Drawing Sheets

Embodiment of 12/026530

Embodiment of 12/026530

Embodiment of 12/026530

Embodiment of 12/026530

FORMED CERAMIC RECEIVER ELEMENT ADHERED TO A SEMICONDUCTOR LAMINA

BACKGROUND OF THE INVENTION

The invention relates to a method to form a ceramic receiver element adhered to a thin lamina. The structure is suitable for fabrication of devices, including photovoltaic devices.

Fabrication of devices including semiconductor material, including photovoltaic cells, may expose the semiconductor material and any supporting element to relatively high temperatures. Thus there is a need for a supporting element that can readily tolerate high temperature.

SUMMARY OF THE INVENTION

The present invention is defined by the following claims, and nothing in this section should be taken as a limitation on those claims. In general, the invention is directed to a method to form a ceramic receiver element adhered to a thin semiconductor lamina.

A first aspect of the invention provides for method to fabricate a structure, the method comprising: defining a cleave plane in a semiconductor donor body; applying a ceramic mixture to a first surface of the semiconductor donor body, wherein the ceramic mixture comprises ceramic powder and a binder; curing the ceramic mixture to form a ceramic body; and cleaving a semiconductor lamina from the semiconductor donor body at the cleave plane, wherein the lamina remains affixed to the ceramic body at the first surface.

Another aspect of the invention provides for a method to fabricate a photovoltaic cell, the method comprising: defining a cleave plane in a semiconductor donor body; applying a ceramic mixture to a first surface of the semiconductor donor body, wherein the ceramic mixture comprises ceramic powder and a binder; curing the ceramic mixture to form a ceramic body; and cleaving a semiconductor lamina from the semiconductor donor body at the cleave plane, wherein the lamina remains affixed to the ceramic body at the first surface, wherein the lamina is suitable for use in a photovoltaic cell.

Each of the aspects and embodiments of the invention described herein can be used alone or in combination with one another.

The preferred aspects and embodiments will now be described with reference to the attached drawings.

DETAILED DESCRIPTION OF THE EMBODIMENTS

Figure 1:
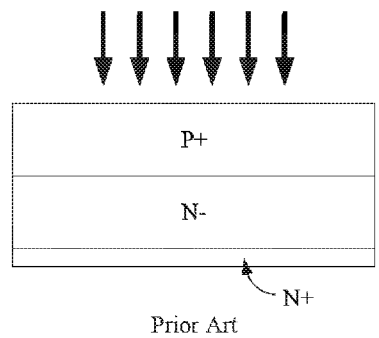
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n-junction (as shown in FIG. 1) or a n+/p-junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
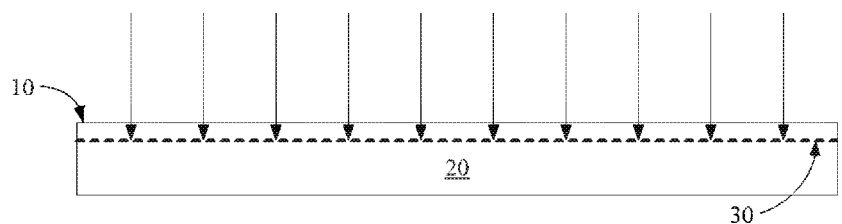
FIGS. 2a-2d are cross-sectional views of stages of fabrication of a photovoltaic cell formed according to an embodiment of U.S. patent application Ser. No. 12/026,530.
Figure 2B:
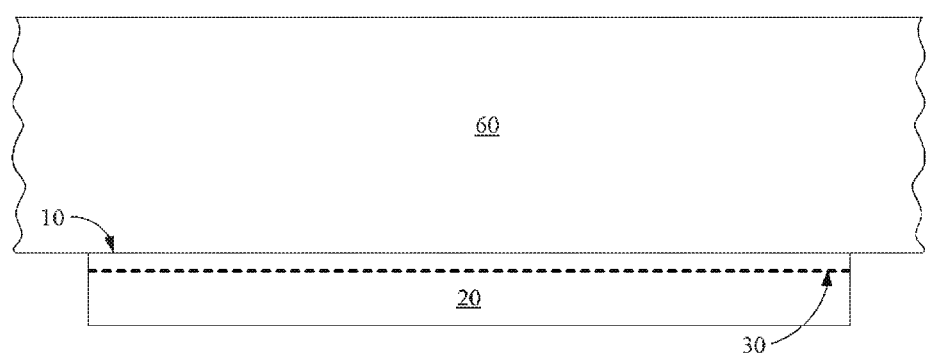
Figure 2C:
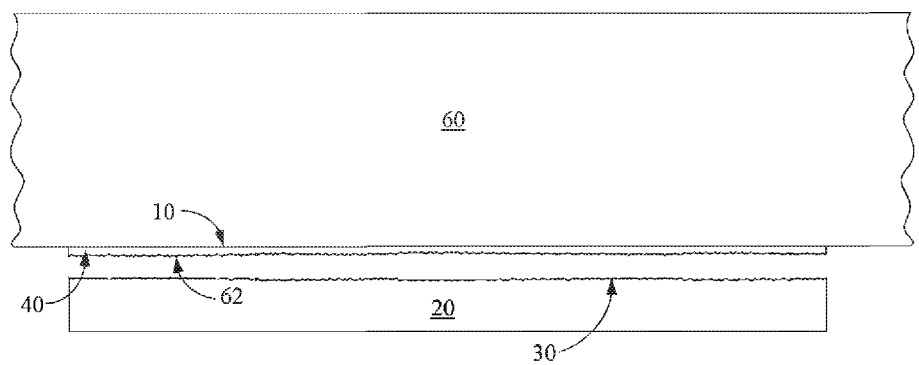
Figure 2D:
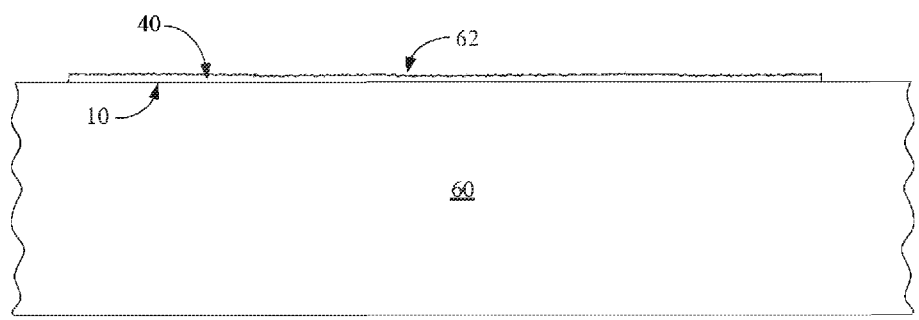

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., photovoltaic cells, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use.

Referring to FIG. 2d, during subsequent fabrication steps, the structure, including the lamina 40 and the receiver 60, may be subjected to relatively high temperatures, for example 700, 800, 900 degrees C. or higher. The receiver element 60 must be formed of a material that can tolerate this temperature. Ceramics can readily tolerate high temperature, and thus are an advantageous choice.

Figure 3A:
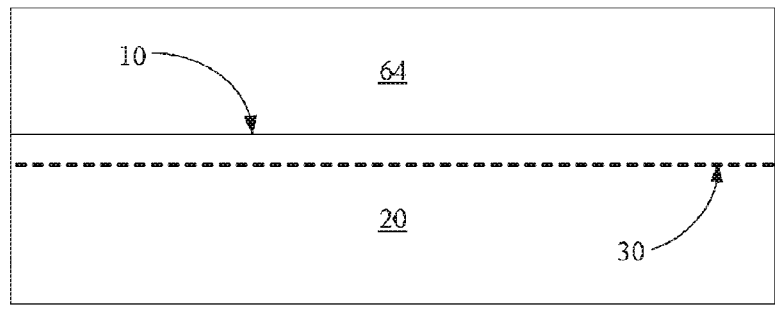
FIGS. 3a and 3b are cross-sectional views illustrating stages in formation of a structure according to aspects of the present invention.
Figure 3B:
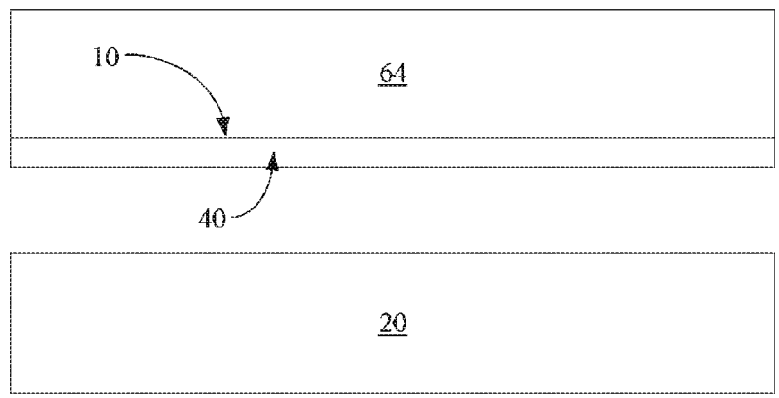

In the present application, turning to FIG. 3a, a ceramic mixture 64 is applied to first surface 10 of the semiconductor donor wafer 20, in which cleave plane 30 has been previously defined. The ceramic mixture 64 includes ceramic powder and a binder, which may be liquid. The applied ceramic mixture 64 is cured in place, allowing outgassing of volatiles. Following the cure step, a ceramic receiver element 64 has been formed adhered to the donor body 20, which then provides structural support during cleaving of the lamina 40, shown in FIG. 3b. Lamina 40 remains permanently adhered to ceramic receiver element 64. Lamina 40 is suitable for fabrication of a device, which may be a photovoltaic cell or some other device. The completed device comprises lamina 40. Semiconductor lamina 40 and ceramic receiver element 64 can tolerate high temperature, for example 1000 degrees C. or more.

Applying a ceramic mixture to the donor body and curing it in place is an effective way to form a lamina adhered to a ceramic substrate. Other approaches to creating such a structure may encounter difficulties. A ceramic body cannot be anodically bonded to a semiconductor body. If a pre-formed ceramic body is adhered to a semiconductor donor body using an adhesive, during the curing process, volatiles will be trapped between the donor body and the pre-formed ceramic body, forming bubbles, which will prevent formation of a continuous bond. Any voids between the adhered surfaces of the donor wafer and the receiver element will result in holes in the lamina after cleaving.

In some embodiments, a conductive component is included in the ceramic mixture, so that the ceramic receiver element 64 is conductive. If electrical contact is to be made to the adhered face 10 of the semiconductor lamina, such electrical contact is simplified if receiver element 64 is ceramic. The coefficients of thermal expansion of ceramic and silicon are similar, allowing for a robust bond.

Figure 4:
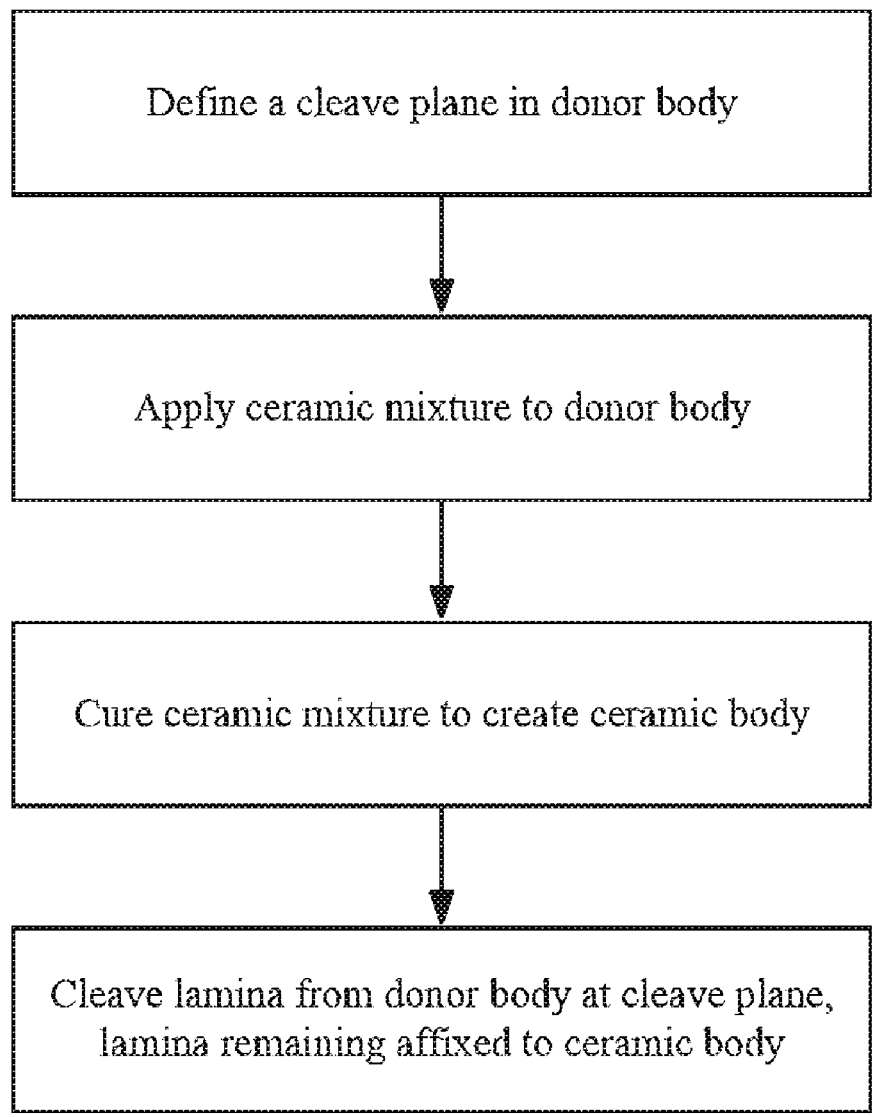
FIG. 4 is a flow chart detailing the steps of a method according to aspects of the present invention.

Turning to the flow chart of FIG. 4, what has been described is a method to fabricate a structure, the method comprising: defining a cleave plane in a semiconductor donor body; applying a ceramic mixture to a first surface of the semiconductor donor body, wherein the ceramic mixture comprises ceramic powder and a binder; curing the ceramic mixture to form a ceramic body; and cleaving a semiconductor lamina from the semiconductor donor body at the cleave plane, wherein the lamina remains affixed to the ceramic body at the first surface.

For clarity, a detailed example of a photovoltaic assembly including a ceramic receiver element and a lamina having thickness between 0.2 and 100 microns, in which a ceramic mixture is applied to the donor body and cured in place to create the ceramic receiver element, according to embodiments of the present invention, will be provided. For completeness, many materials, conditions, and steps will be described. It will be understood, however, that many of these details can be modified, augmented, or omitted while the results fall within the scope of the invention.

EXAMPLE

The process begins with a donor body of an appropriate semiconductor material. An appropriate donor body may be a monocrystalline silicon wafer of any practical thickness, for example from about 200 to about 1000 microns thick. Typically the wafer has a <100> orientation, though wafers of other orientations may be used. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 5A:
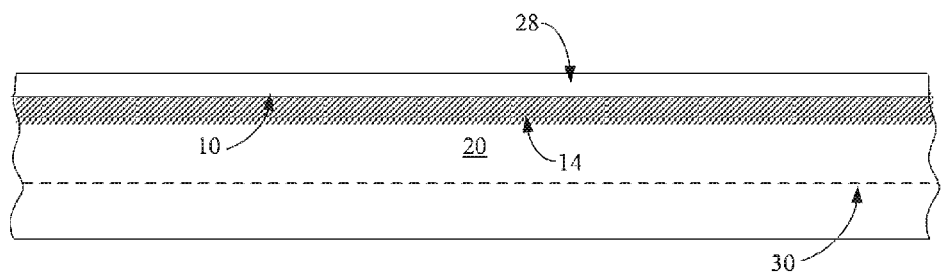
FIGS. 5a-5e are cross-sectional views illustrating stages in formation of a structure according to embodiments of the present invention.

Referring to FIG. 5a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1 \times 10^{15}$ and about $1 \times 10^{18}$ dopant atoms/cm$^3$, for example about $1 \times 10^{17}$ dopant atoms/cm$^3$. Donor wafer 20 may be, for example, solar- or semiconductor-grade silicon.

First surface 10 may be heavily doped to some depth to the same conductivity type as wafer 20, forming heavily doped region 14; in this example, heavily doped region 14 is n-type. This doping step can be performed by any conventional method, including diffusion doping. Any conventional n-type dopant may be used, such as phosphorus or arsenic. Dopant concentration may be as desired, for example at least $1 \times 10^{18}$ dopant atoms/cm$^3$, for example between about $1 \times 10^{18}$ and $1 \times 10^{21}$ dopant atoms/cm$^3$. Doping and texturing can be performed in any order, but since most texturing methods remove some thickness of silicon, it may be preferred to form heavily doped n-type region 14 following texturing. Heavily doped region 14 will provide electrical contact to the base region in the completed device.

Next, in the present embodiment, a dielectric layer 28 is formed on first surface 10. As will be seen, in the present example first surface 10 will be the back of the completed photovoltaic cell, and a conductive material is to be formed on dielectric layer 28. The reflectivity of the conductive layer to be formed is enhanced if dielectric layer 28 is relatively thick. For example, if dielectric layer 28 is silicon dioxide, it may be between about 1000 and about 1500 angstroms thick, while if dielectric layer 28 is silicon nitride, it may be between about 700 and about 800 angstroms thick, for example about 750 angstroms. This layer may be grown or deposited by any suitable method. A grown oxide or nitride layer 28 passivates first surface 10 better than if this layer is deposited. In some embodiments, a first thickness of dielectric layer 28 may be grown, while the rest is deposited.

In the next step, ions, preferably hydrogen or a combination of hydrogen and helium, are implanted into wafer 20 through first surface 10 to define cleave plane 30, as described earlier. This implant may be performed using the teachings of Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns.

Figure 5B:
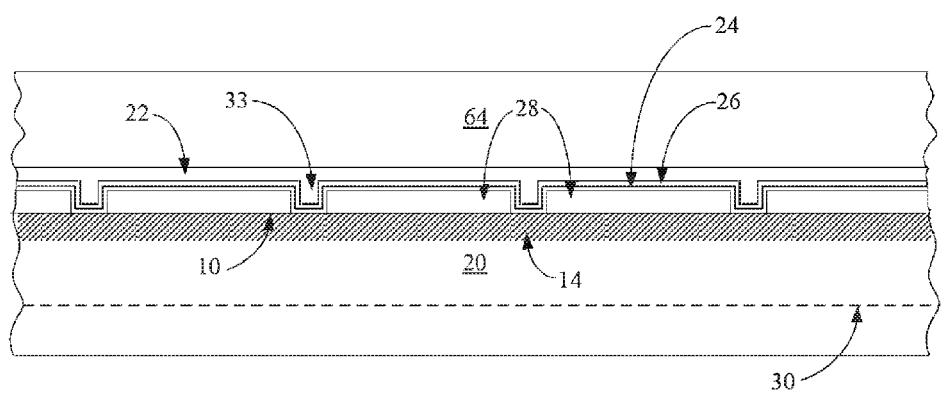

Turning to FIG. 5b, after implant, openings 33 are formed in dielectric layer 28 by any appropriate method, for example by laser scribing or screen printing. The size of openings 33 may be as desired, and will vary with dopant concentration, metal used for contacts, etc. In one embodiment, these openings may be about 40 microns square. Note that figures are not to scale.

A cobalt or titanium layer 24 is formed on dielectric layer 28 by any suitable method, for example by sputtering or thermal evaporation. This layer may have any desired thickness, for example between about 100 and about 400 angstroms, in some embodiments about 200 angstroms thick or less, for example about 100 angstroms. Layer 24 may be cobalt or titanium or an alloy thereof, for example, an alloy which is at least 80 or 90 atomic percent cobalt or titanium. Cobalt layer 24 is in immediate contact with first surface 10 of donor wafer 20 through openings 33 in dielectric layer 28; elsewhere it contacts dielectric layer 28. In alternative embodiments, dielectric layer 28 is omitted, and titanium layer 24 is formed in immediate contact with donor wafer 20 at all points of first surface 10.

Non-reactive barrier layer 26 is formed on and in immediate contact with cobalt layer 24. This layer is formed by any suitable method, for example by sputtering or thermal evaporation. Non-reactive barrier layer 26 may be any material, or stack of materials, that will not react with silicon, is conductive, and will provide an effective barrier to the low-resistance layer to be formed in a later step. Suitable materials for non-reactive barrier layer include TiN, TiW, W, Ta, TaN, TaSiN, Ni, Mo, Zr, or alloys thereof. The thickness of non-reactive barrier layer 26 may range from, for example, between about 100 and about 3000 angstroms, for example between about 500 and about 1000 angstroms. In some embodiments this layer is about 700 angstroms thick.

Low-resistance layer 22 is formed on non-reactive barrier layer 26. This layer may be, for example, titanium, cobalt, silver, or tungsten or alloys thereof. In this example low-resistance layer 22 is cobalt or an alloy that is at least 80 or 90 atomic percent cobalt, formed by any suitable method. Cobalt layer 22 may be between about 500 and about 10,000 angstroms (1 micron) thick, for example about 3000 angstroms thick.

At this point a ceramic mixture 64, including a ceramic powder and a binder, for example a liquid binder, is applied on cobalt layer 22. The ceramic powder can be any suitable material, for example aluminum silicate, also known as mullite, or zirconium silicate. Any of these forms, or any other suitable ceramic, may be used. A conductive component, such as graphite powder or metal filings, may be included to cause the resulting ceramic body to be conductive. A sodium silicate solution, for example a 40 percent dilution of pure sodium silicate in water, may serve as a binder. In one example, a mixture was formed by mixing 75 g of aluminum silicate and 55 g of graphite powder (55 g) with 135 g of liquid sodium silicate in a 40 percent dilution. A mixture should be selected that can be cured at a temperature, and within a time, that will not trigger premature cleaving of a lamina at cleave plane 30. As will be understood by those skilled in the art, these ratios may be varied to achieve the desired conductivity, cure conditions, etc. Other binders, ceramic powders, or conductive components may be substituted.

Ceramic mixture 64 should be applied with sufficient thickness to achieve uniform distribution and to make a receiver element of adequate strength, but not so thick that it will tend to hinder outgassing. A finished thickness of about 1 to about 3 mm thick, for example about 1.6 to about 2 mm thick, may be preferred.

Ceramic mixture 64 may be applied by any suitable method, for example by squeegee, spray, or jet writer. A stencil may be employed to prevent application of the ceramic mixture to the edge of donor body 20, as ceramic material wrapped around the edge of the donor body may interfere with eventual cleaving of the lamina. A stencil may occlude, for example, the outermost 1 to 2 mm of the surface of donor wafer 20.

Curing should be performed slowly enough to allow outgassing. If the mixture skins over early in the curing process, volatiles will be unable to outgas. In one example, curing is performed for twenty-four hours at room temperature, though cure time can be reduced by increasing cure temperature. After cure, ceramic body 64 in the present example is between about 1.6 and about 2.0 mm thick, is rigid enough and strong enough to be handled by standard wafer-handling equipment without damage, and can tolerate temperatures as high as about 1500 degrees C.

Following cure, temperature is ramped, either continuously or in increments, for example in an oven. In one example, temperature was ramped successively to 75 degrees C., to 110 degrees C., to 250 degrees C., and finally to 520 degrees C., with a dwell time of about two hours at each temperature, though one skilled in the art will appreciate that this sequence may be varied or optimized. Exfoliation of lamina 40, shown in FIG. 5c, occurs at about 520 degrees C.

Figure 5C:
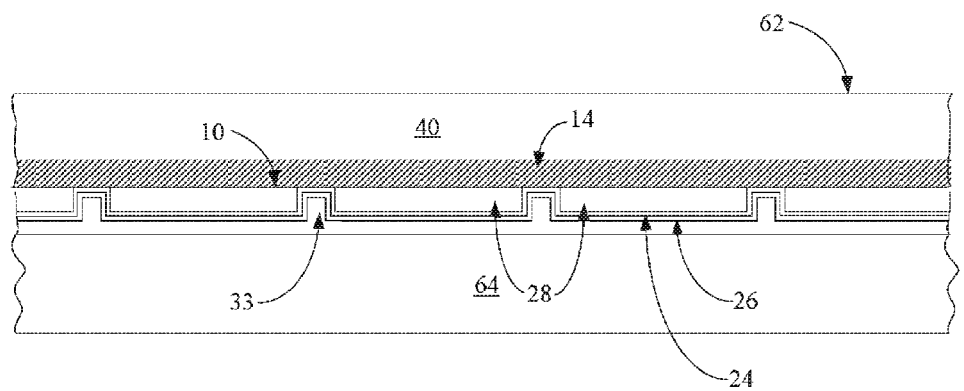

FIG. 5c shows the structure inverted with formed ceramic receiver element 64 on the bottom. In this example, exfoliation occurred at about 520 degrees C. In general, exfoliation may be achieved at temperatures between, for example, about 350 and about 650 degrees C., where exfoliation typically proceeds more rapidly at higher temperature. The thickness of lamina 40 is determined by the depth of cleave plane 30. In many embodiments, the thickness of lamina 40 is between about 1 and about 10 microns, for example between about 2 and about 5 microns or 6 microns, for example about 4 or about 4.5 microns.

In alternative embodiments, the receiver element 64 could be accreted in a series of layers, each applied and cured in turn, rather than in a single application and cure step. In this case each individual cure step would be shorter.

During relatively high-temperature steps, such as the exfoliation of lamina 40, the portions of cobalt layer 24 in immediate contact with silicon lamina 40 will react to form cobalt silicide. If dielectric layer 28 was included, cobalt silicide is formed where first surface 10 of lamina 40 was exposed in vias 33. If dielectric layer 28 was omitted, in general all of the cobalt of cobalt layer 24 will be consumed, forming a blanket of cobalt silicide.

Second surface 62 has been created by exfoliation. At this point texturing can be created at second surface 62 according to embodiments of the present invention. A standard clean is performed at second surface 62, for example by hydrofluoric acid. To avoid absorption by ceramic receiver element 64, single-sided processing techniques may be used for this and subsequent wet processing steps.

A method for forming advantageous low-relief texture is disclosed in Li et al., U.S. patent application Ser. No. 12/729,878, "Creation of Low-Relief Texture for a Photovoltaic Cell," filed Mar. 23, 2010, owned by the assignee of the present invention and hereby incorporated by reference.

In some embodiments, an anneal may be performed to repair damage caused to the crystal lattice throughout the body of lamina 40 during the implant step. Annealing may be performed, for example, at 500 degrees C. or greater, for example at 550, 600, 650, 700 degrees C. or greater, at about 950 degrees C. or more. The structure may be annealed, for example, at about 650 degrees C. for about 45 minutes, or at about 800 degrees for about two minutes, or at about 950 degrees for 60 seconds or less. In many embodiments the temperature exceeds 900 degrees C. for at least 30 seconds. In other embodiments, no damage anneal is performed.

Figure 5D:
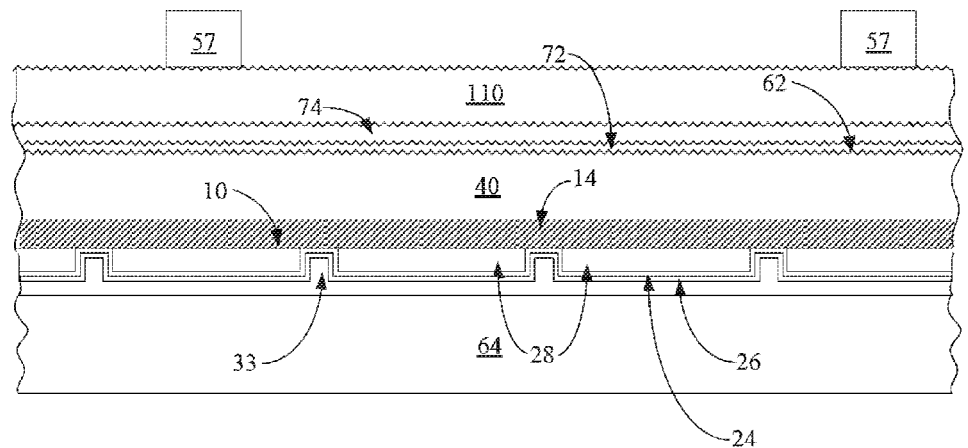

Referring to FIG. 5d, if any native oxide (not shown) has formed on second surface 62 during annealing, it may be removed by any conventional cleaning step, for example by hydrofluoric acid. After cleaning, a silicon layer is deposited on second surface 62. This layer 74 includes heavily doped silicon, and may be amorphous, microcrystalline, nanocrystalline, or polycrystalline silicon, or a stack including any combination of these. This layer or stack may have a thickness, for example, between about 50 and about 350 angstroms. FIG. 5d shows an embodiment that includes intrinsic amorphous silicon layer 72 between second surface 62 and doped layer 74. In other embodiments, layer 72 may be omitted. In this example, heavily doped silicon layer 74 is doped p-type, opposite the conductivity type of lightly doped n-type lamina 40, and serves as the emitter of the photovoltaic cell being formed, while lightly doped n-type lamina 40 comprises the base region. If included, layer 72 is sufficiently thin that it does not impede electrical connection between lamina 40 and doped silicon layer 74. Note that in general deposited amorphous silicon is conformal; thus the texture at surface 62 is reproduced at the surfaces of silicon layers 72 and 74.

A transparent conductive oxide (TCO) layer 110 is formed on heavily doped silicon layer 74. Appropriate materials for TCO 110 include indium tin oxide, as well as aluminum-doped zinc oxide, tin oxide, titanium oxide, etc.; this layer may be, for example, about 1000 angstroms thick, and serves as both a top electrode and an antireflective layer. In alternative embodiments, an additional antireflective layer (not shown) may be formed on top of TCO 110.

A photovoltaic cell has been formed, including lightly doped n-type lamina 40, which comprises the base of the cell, and heavily doped p-type amorphous silicon layer 74, which serves as the emitter of the cell. Heavily doped n-type region 14 will improve electrical contact to the cell. Electrical contact must be made to both faces of the cell. Contact to emitter 74 is made, for example, by gridlines 57. If, as in the present example, ceramic receiver element 64 is conductive, it has been formed in electrical contact with heavily doped region 14 by way of conductive layers 24, 26, and 22.

If ceramic receiver element 64 is not conductive, this contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference. If the methods of the '064 application are employed, for example, gridlines 57 (formed by any suitable method) make electrical contact to heavily doped p-type amorphous silicon layer 74 by way of TCO 110, while contact is made to the base of the cell by way of heavily doped n-type layer 14.

Figure 5E:
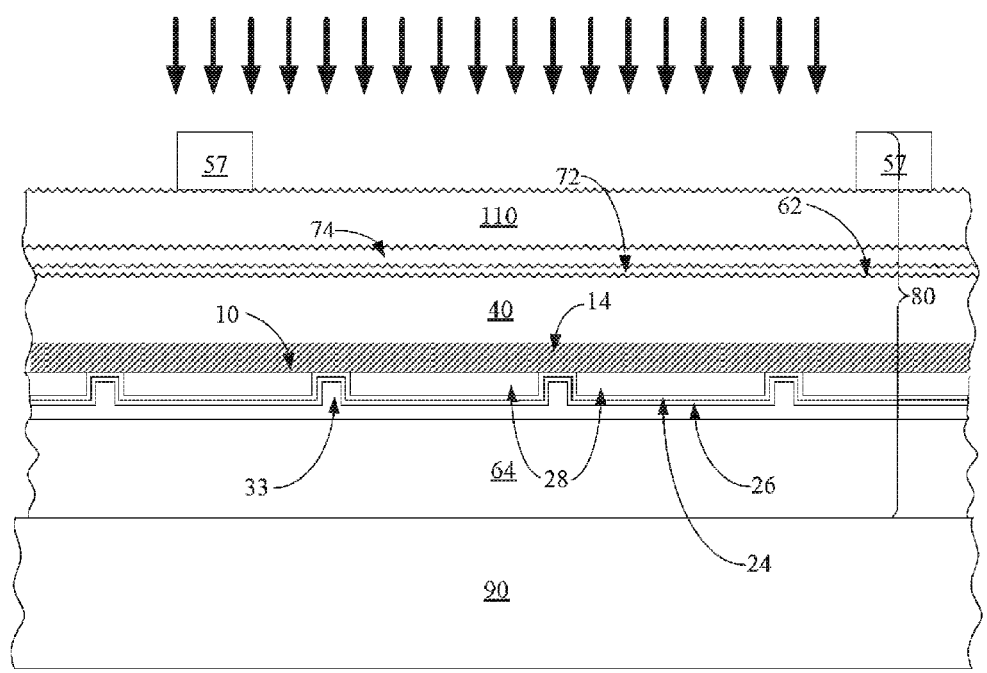

FIG. 5e shows completed photovoltaic assembly 80, which includes a photovoltaic cell and ceramic receiver element 64. In alternative embodiments, by changing the dopants used, heavily doped region 14 may serve as the emitter, at first surface 10, while heavily doped silicon layer 74 serves as a contact to the base region. Incident light (indicated by arrows) falls on TCO 110, enters the cell at heavily doped p-type amorphous silicon layer 74, enters lamina 40 at second surface 62, and travels through lamina 40. Reflective layer 24 will serve to reflect some light back into the cell. In this embodiment, receiver element 64 serves as a substrate. Receiver element 64 and lamina 40, and associated layers, form a photovoltaic assembly 80. Multiple photovoltaic assemblies 80 can be formed and affixed to a supporting substrate 90 or, alternatively, a supporting superstrate (not shown). Each photovoltaic assembly 80 includes a photovoltaic cell. The photovoltaic cells of a module are generally electrically connected in series. Additional fabrication details of such a cell are provided in Herner, U.S. patent application Ser. No. 12/540,463, "Intermetal Stack for Use in a Photovoltaic Device," filed Aug. 13, 2009, owned by the assignee of the present application and hereby incorporated by reference.

The structure shown in FIG. 5e comprises a monocrystalline semiconductor lamina having a thickness between about 1 micron and about 10 microns, and a ceramic body, the semiconductor lamina permanently affixed to the ceramic body. The thickness of the ceramic body is less than about 4 mm.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to fabricate a structure, the method comprising: defining a cleave plane in a semiconductor donor body; applying a ceramic mixture to a first surface of the semiconductor donor body, wherein the ceramic mixture comprises ceramic powder and a binder; curing the ceramic mixture to form a ceramic body; and cleaving a semiconductor lamina from the semiconductor donor body at the cleave plane, wherein the lamina remains affixed to the ceramic body at the first surface, a metallic layer is disposed between the lamina and the ceramic body; a dielectric layer is disposed between the metallic layer and the lamina; and the metallic layer contacts the lamina through openings in the dielectric layer.

2. The method of claim 1 wherein the lamina has a thickness between about 1 micron and about 20 microns.

3. The method of claim 1 wherein the lamina has a thickness between about 2 microns and about 6 microns.

4. The method of claim 1 wherein the ceramic powder comprises aluminum silicate.

5. The method of claim 1 wherein the ceramic powder comprises zirconium silicate.

6. The method of claim 1 wherein the ceramic mixture comprises a conductive component.

7. The method of claim 6 wherein the conductive component is graphite.

8. The method of claim 1 wherein the semiconductor donor body is monocrystalline silicon.

9. The method of claim 1 wherein the step of defining a cleave plane comprises implanting hydrogen ions through the first surface.

10. The method of claim 1 wherein the lamina is suitable for use in a photovoltaic cell.

11. The method of claim 10 further comprising the step of fabricating a photovoltaic cell, the photovoltaic cell comprising the lamina.

12. The method of claim 10 wherein, during the fabricating step, processing temperature exceeds 900° degrees C. for at least 30 seconds.

13. The method of claim 10 wherein the lamina comprises the base region of the photovoltaic cell.

14. The method of claim 1 wherein, in the completed device, the ceramic body has a thickness between about 1 and about 3 mm thick.

15. The method of claim 1 wherein the metallic layer is cobalt or an alloy that is at least 80 atomic percent cobalt.

16. The method of claim 1 wherein the cleaving step creates a second surface of the lamina, and further comprising depositing amorphous silicon on the second surface.

17. The method of claim 1 further comprising, before the step of defining a cleave plane, heavily doping the first surface.

18. The method of claim 17 wherein the first surface is heavily doped by diffusion doping.

19. The method of claim 1 wherein the ceramic body is conductive.

20. A method to fabricate a photovoltaic cell, the method comprising: defining a cleave plane in a semiconductor donor body; applying a ceramic mixture to a first surface of the semiconductor donor body, wherein the ceramic mixture comprises ceramic powder and a binder; curing the ceramic mixture to form a ceramic body; and cleaving a semiconductor lamina from the semiconductor donor body at the cleave plane, wherein the lamina remains affixed to the ceramic body at the first surface, wherein the lamina is suitable for use in a photovoltaic cell, a metallic layer is disposed between the lamina and the ceramic body; a dielectric layer is disposed between the metallic layer and the lamina; and the metallic layer contacts the lamina through openings in the dielectric layer.

* * * * *